United States Patent
Cao et al.

(10) Patent No.: US 9,672,784 B2
(45) Date of Patent: Jun. 6, 2017

(54) CMOS GATE DRIVING CIRCUIT

(71) Applicant: Shenzhen China Star Optoelectronics Technology Co., Ltd., Shenzhen (CN)

(72) Inventors: Shangcao Cao, Shenzhen (CN); Changyeh Lee, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 151 days.

(21) Appl. No.: 14/761,305

(22) PCT Filed: Apr. 22, 2015

(86) PCT No.: PCT/CN2015/077151
§ 371 (c)(1),
(2) Date: Jul. 15, 2015

(87) PCT Pub. No.: WO2016/155052
PCT Pub. Date: Oct. 6, 2016

(65) Prior Publication Data
US 2016/0307533 A1 Oct. 20, 2016

(30) Foreign Application Priority Data
Mar. 30, 2015 (CN) .......................... 2015 1 0145378

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0283* (2013.01); *G09G 2310/0286* (2013.01); *G09G 2330/021* (2013.01)

(58) Field of Classification Search
USPC ........................................................ 345/100
See application file for complete search history.

(56) References Cited

U.S. PATENT DOCUMENTS

2016/0188074 A1* 6/2016 Xiao ...................... G06F 3/0416
                                                           345/173
2016/0351156 A1* 12/2016 Wu ......................... G11C 19/28

* cited by examiner

*Primary Examiner* — Joseph Haley
*Assistant Examiner* — Ifedayo Iluyomade
(74) *Attorney, Agent, or Firm* — Leong C. Lei (57) ABSTRACT

The present invention provides a CMOS gate driving circuit, comprising a plurality of shift register units which are cascade connected, and the shift register unit of the nth stage comprises: a forward-backward scan module, a latch module (200) electrically coupled to the forward-backward scan module and an output module (400) electrically coupled to the latch module; the forward-backward scan module comprises: a first module (100) and a second module (300), and the first module (100) is a transmission module in forward scan and a pull-down module in backward scan; the second module (300) is a pull-down module in forward scan and a transmission module in backward scan; both the first module (100) and the second module (300) comprise a NAND gate, which can achieve forward-backward scan for ensuring the stability of the GOA function and the smooth output of the scan voltage signal to raise the stage transfer efficiency and to effectively reduce the sequence delay of the stage transfer; meanwhile, the multiple functions of the circuit module can be achieved, and the frame width of the screen can be decreased and the power consumption can be lowered.

18 Claims, 7 Drawing Sheets

CMOS GATE DRIVING CIRCUIT

FIELD OF THE INVENTION

The present invention relates to a display technology field, and more particularly to a CMOS gate driving circuit.

BACKGROUND OF THE INVENTION

The Liquid Crystal Display (LCD) possesses advantages of thin body, power saving and no radiation to be widely used in many application scope. Such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate of the thin film transistor is coupled to a level scan line, and the drain is coupled to a vertical data line, and the source is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. The driving of the level scan line in the present active liquid crystal display is mainly accomplished by the external Integrated Circuit (IC). The external IC can control the charge and discharge stage by stage of the level scan lines of respective stages. The GOA technology, i.e. the Gate Driver on Array technology can utilize the original array manufacture processes of the liquid crystal display panel to manufacture the driving circuit of the level scan lines on the substrate around the active area, to replace the external IC for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

The main structure of the CMOS gate driving circuit utilizing the GOA technology according to prior art comprises a forward-backward scan module, an output module, a signal transfer module and a latch module. The width of the GOA circuit is the main factor influencing the width of the screen frame (border). The CMOS gate driving circuit utilizing the GOA technology according to prior art commonly uses the transmission gate circuit to realize the forward-backward scan, of which the stage transfer efficiency is lower, and the sequence delay of the stage transfer is longer, and the power consumption is higher. Besides, the functions of respective modules are single. It is disadvantageous for reducing the width of the screen frame.

SUMMARY OF THE INVENTION

An objective of the present invention is to provide a CMOS gate driving circuit, capable of realizing the forward-backward scan for ensuring the stability of the GOA function and the smooth output of the scan voltage signal to raise the stage transfer efficiency and to effectively reduce the sequence delay of the stage transfer; meanwhile, the multiple functions of the circuit module can be achieved, and the frame width of the screen can be decreased and the power consumption can be lowered, and particularly, the present invention is applicable to a narrow frame or frameless liquid crystal display.

For realizing the aforesaid objective, the present invention provides a CMOS gate driving circuit, comprising a plurality of shift register units which are cascade connected, and n is set to be a positive integer, and except the shift register units of the first stage and the last stage, the shift register unit of the nth stage comprises: a forward-backward scan module, a latch module electrically coupled to the forward-backward scan module and an output module electrically coupled to the latch module;

the forward-backward scan module comprises: a first module and a second module, and the first module is a transmission module in forward scan and a pull-down module in backward scan; the second module is a pull-down module in forward scan and a transmission module in backward scan;

the first module comprises: a first NAND gate, and two input ends of the first NAND gate are electrically coupled to a forward scan voltage level signal and a stage transfer signal outputted by the shift register unit of the former stage, respectively, and an output end is electrically coupled to a third node; a first N-type thin film transistor, and a gate of the first N-type thin film transistor is electrically coupled to a scan voltage signal outputted by the shift register unit of the former stage, and a source is electrically coupled to the third node, and a drain is electrically coupled to a first node;

the second module comprises: a second NAND gate, and two input ends of the second NAND gate are electrically coupled to a backward scan voltage level signal and a stage transfer signal outputted by the shift register unit of the latter stage, respectively, and an output end is electrically coupled to a fourth node; a second N-type thin film transistor, and a gate of the second N-type thin film transistor is electrically coupled to a scan voltage signal outputted by the shift register unit of the latter stage, and a source is electrically coupled to the fourth node, and a drain is electrically coupled to the first node.

In forward scan, the forward scan voltage level signal is high voltage level, and the backward scan voltage level signal is low voltage level;

In backward scan, the forward scan voltage level signal is low voltage level, and the backward scan voltage level signal is high voltage level.

The latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node; a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

In the relationship of the first stage of the CMOS gate driving circuit, the gate of the first N-type thin film transistor is electrically coupled to a start signal, and the two input ends of the first NAND gate are electrically coupled to the start signal and the forward scan voltage level signal, respectively; in the relationship of the last stage of the CMOS gate driving circuit, the gate of the second N-type thin film transistor is electrically coupled to a start signal, and the two input ends of the second NAND gate are electrically coupled to the start signal and the backward scan voltage level signal, respectively.

The first module further comprises: a third N-type thin film transistor, and a gate of the third N-type thin film transistor is electrically coupled to the scan voltage signal outputted by the shift register unit of the former stage, and a source is electrically coupled to the drain of the first N-type thin film transistor, and a drain is electrically coupled to the first node;

the second module further comprises: a fourth N-type thin film transistor, and a gate of the fourth N-type thin film transistor is electrically coupled to the scan voltage signal outputted by the shift register unit of the latter stage, and a source is electrically coupled to the drain of the second N-type thin film transistor, and a drain is electrically coupled to the first node.

In the relationship of the first stage of the CMOS gate driving circuit, the gates of the first, the third N-type thin film transistors are electrically coupled to a start signal, and the two input ends of the first NAND gate are electrically coupled to the start signal and the forward scan voltage level signal, respectively; in the relationship of the last stage of the CMOS gate driving circuit, the gate of the second, the fourth N-type thin film transistors are electrically coupled to a start signal, and the two input ends of the second NAND gate are electrically coupled to the start signal and the backward scan voltage level signal, respectively.

The latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node; a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

The latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of an N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the second inverter, and a gate of the P-type thin film transistor is electrically coupled to the output end of the fourth inverter and a gate of a sixth P-type thin film transistor, and a source is electrically coupled to the source of the N-type thin film transistor and the sequence signal, and a drain is electrically coupled to the drain of the N-type thin film transistor and the input end of the second inverter; a capacitor, and one end of the capacitor is electrically coupled to the first node, and the other end is electrically coupled to the constant high voltage level;

the output module comprises: the sixth P-type thin film transistor, and the gate of the sixth P-type thin film transistor is electrically coupled to the output end of the fourth inverter and the gate of the P-type thin film transistor of the transmission gate, and a source is electrically coupled to a constant low voltage level, and a drain is electrically coupled to a source of a seventh N-type thin film transistor; the seventh N-type thin film transistor, and a gate of the seventh N-type thin film transistor is electrically coupled to the restore signal and a gate of an eighth P-type thin film transistor, and a source is electrically coupled to the drain of the sixth P-type thin film transistor, and a drain is electrically coupled to a source of the eighth P-type thin film transistor and the input end of the second inverter; the eighth P-type thin film transistor, and the gate of the eighth P-type thin film transistor is electrically coupled to the restore signal and the gate of the seventh N-type thin film transistor, and a source is electrically coupled to the drain of the seventh N-type thin film transistor and the input end of the second inverter, and a drain is electrically coupled to a constant high voltage level; the second inverter, and the input end of the second inverter is electrically coupled to the drain of the seventh N-type thin film transistor and the drain of the P-type thin film transistor of the transmission gate, and the output end is electrically coupled to an input end of a third inverter; the third inverter, the input end of the third inverter is electrically coupled to the output end of the second inverter, and an output end is electrically coupled to a scan voltage signal.

The latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of a N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the fifth inverter, and a gate of the P-type thin film transistor is electrically coupled to the output end of the fourth inverter, and a source is electrically coupled to the source of the N-type thin film transistor and the sequence signal, and a drain is electrically coupled to the drain of the N-type thin film transistor and the input end of the fifth inverter; a capacitor, and one end of the capacitor is electrically coupled to the first node, and the other end is electrically coupled to the constant high voltage level;

the output module comprises: a fifth inverter, and an input end of the fifth inverter is electrically coupled to the drain of the N-type thin film transistor of the transmission gate, and an output end is electrically coupled to an input end of a fourth NAND gate; the fourth NAND gate, and two input ends of the fourth NAND gate are electrically coupled to the output end of the fifth inverter and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

A sequence signal comprises two sets of sequence signals: a first sequence signal and a second sequence signal.

The latch module keeps the first node to be low voltage level in an output period, and high voltage level in a latch period.

The present invention further provides a CMOS gate driving circuit, comprising a plurality of shift register units which are cascade connected, and n is set to be a positive integer, and except the shift register units of the first stage and the last stage, the shift register unit of the nth stage comprises: a forward-backward scan module, a latch module electrically coupled to the forward-backward scan module and an output module electrically coupled to the latch module;

the forward-backward scan module comprises: a first module and a second module, and the first module is a transmission module in forward scan and a pull-down module in backward scan; the second module is a pull-down module in forward scan and a transmission module in backward scan;

the first module comprises: a first NAND gate, and two input ends of the first NAND gate are electrically coupled to a forward scan voltage level signal and a stage transfer signal outputted by the shift register unit of the former stage, respectively, and an output end is electrically coupled to a third node; a first N-type thin film transistor, and a gate of the first N-type thin film transistor is electrically coupled to a scan voltage signal outputted by the shift register unit of the former stage, and a source is electrically coupled to the third node, and a drain is electrically coupled to a first node;

the second module comprises: a second NAND gate, and two input ends of the second NAND gate are electrically coupled to a backward scan voltage level signal and a stage transfer signal outputted by the shift register unit of the latter stage, respectively, and an output end is electrically coupled to a fourth node; a second N-type thin film transistor, and a gate of the second N-type thin film transistor is electrically coupled to a scan voltage signal outputted by the shift register unit of the latter stage, and a source is electrically coupled to the fourth node, and a drain is electrically coupled to the first node;

in forward scan, the forward scan voltage level signal is high voltage level, and the backward scan voltage level signal is low voltage level;

in backward scan, the forward scan voltage level signal is low voltage level, and the backward scan voltage level signal is high voltage level;

wherein a sequence signal comprises two sets of sequence signals: a first sequence signal and a second sequence signal;

wherein the latch module keeps the first node to be low voltage level in an output period, and high voltage level in a latch period.

The benefits of the present invention are: the CMOS gate driving circuit of the present invention is capable realizing the forward-backward scan with NAND gates and ensuring the stability of the GOA function and the smooth output of the scan voltage signal to raise the stage transfer efficiency and to effectively reduce the sequence delay of the stage transfer; meanwhile, in the forward-backward scan module, the first module is a transmission module in forward scan and a pull-down module in backward scan, and the second module is a pull-down module in forward scan and a transmission module in backward scan. Thus, the multiple functions of the circuit module can be achieved, and the frame width of the screen can be decreased and the power consumption can be lowered, and particularly, the present invention is applicable to a narrow frame or frameless liquid crystal display.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
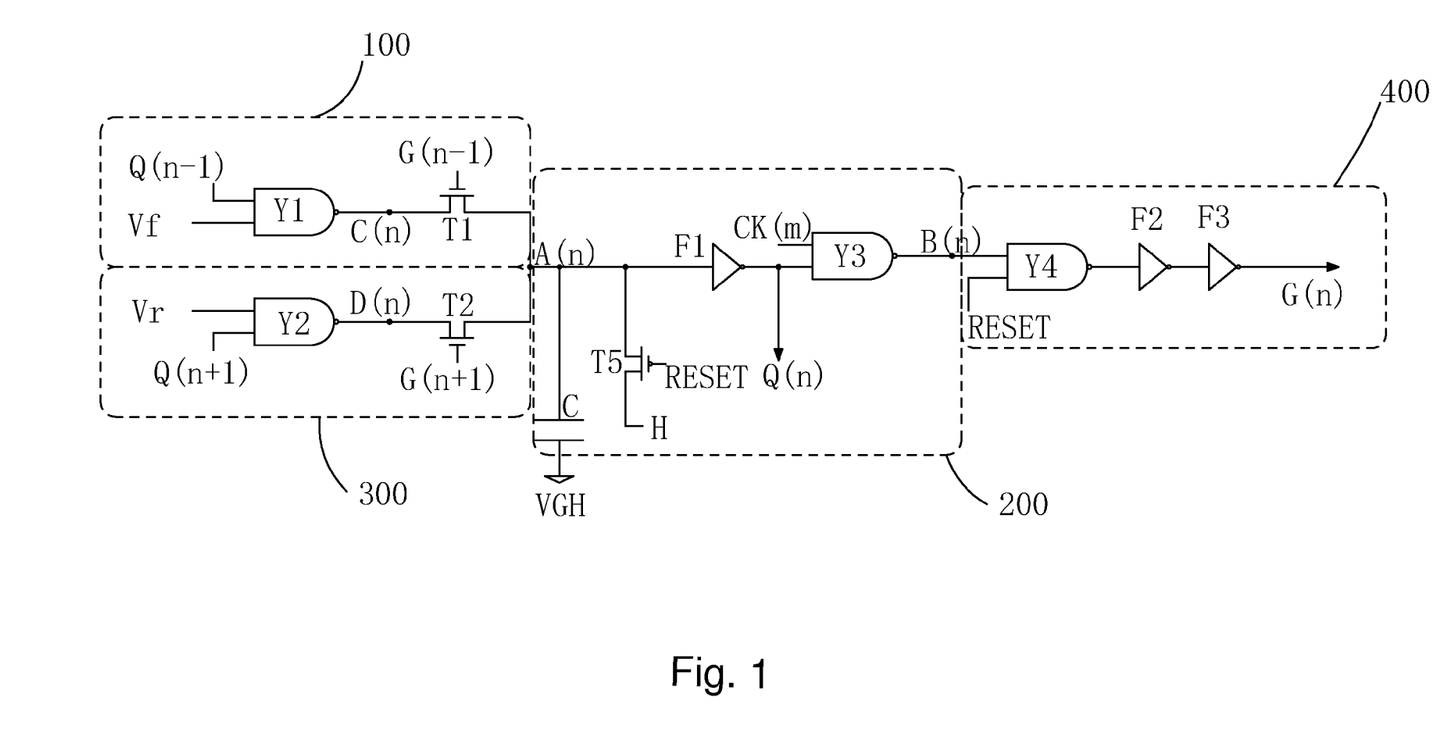
FIG. 1 is a circuit diagram of a CMOS gate driving circuit according to the first embodiment of the present invention.

Please refer to FIG. 1. FIG. 1 is a circuit diagram of a CMOS gate driving circuit according to the first embodiment of the present invention. The CMOS gate driving circuit comprises a plurality of shift register units which are cascade connected, and n is set to be a positive integer, and except the shift register units of the first stage and the last stage, the shift register unit of the nth stage comprises: a forward-backward scan module, a latch module 200 electrically coupled to the forward-backward scan module and an output module 400 electrically coupled to the latch module.

The forward-backward scan module comprises: a first module 100 and a second module 300, and the first module 100 is a transmission module in forward scan and a pull-down module in backward scan; the second module 300 is a pull-down module in forward scan and a transmission module in backward scan.

The first module 100 comprises: a first NAND gate Y1, and two input ends of the first NAND gate Y1 are electrically coupled to a forward scan voltage level signal Vf and a stage transfer signal Q(n−1) outputted by the shift register unit of the former stage, respectively, and an output end is electrically coupled to a third node C(n); a first N-type thin film transistor T1, and a gate of the first N-type thin film transistor T1 is electrically coupled to a scan voltage signal G(n−1) outputted by the shift register unit of the former stage, and a source is electrically coupled to the third node C(n), and a drain is electrically coupled to a first node A(n).

The second module 300 comprises: a second NAND gate Y2, and two input ends of the second NAND gate Y2 are electrically coupled to a backward scan voltage level signal Vr and a stage transfer signal Q(n+1) outputted by the shift register unit of the latter stage, respectively, and an output end is electrically coupled to a fourth node D(n); a second N-type thin film transistor T2, and a gate of the second N-type thin film transistor T2 is electrically coupled to a scan voltage signal G(n+1) outputted by the shift register unit of the latter stage, and a source is electrically coupled to the fourth node D(n), and a drain is electrically coupled to the first node A(n).

The latch module 200 comprises: a fifth P-type thin film transistor T5, and a gate of the fifth P-type thin film transistor T5 is electrically coupled to a restore signal RESET, and a source is electrically coupled to a constant high voltage level H, and a drain is electrically coupled to the first node A(n); a first inverter F1, and an input end of the first inverter F1 is electrically coupled to the first node A(n), and an output end is electrically coupled to a stage transfer signal Q(n) and an input end of a third NAND gate Y3; the third NAND gate Y3, and two input ends of the third NAND gate Y3 are electrically coupled to a sequence signal CK(m) and the output end of the first inverter F1, respectively, and an output end is electrically coupled to a second node B(n); a capacitor C, and one end of the capacitor C is electrically coupled to the first node A(n), and the other end is electrically coupled to the constant high voltage level VGH.

The output module 400 comprises: a fourth NAND gate Y4, and two input ends of the fourth NAND gate Y4 are electrically coupled to the second node B(n) and the restore signal RESET, respectively, and an output end is electrically coupled to an input end of a second inverter F2; the second inverter F2, and the input end of the second inverter F2 is electrically coupled to an output end of the fourth NAND gate Y4, and an output end is electrically coupled to an input end of a third inverter F3; the third inverter F3, and the input end of the third inverter F3 is electrically coupled to the output end of the second inverter F2, and an output end is electrically coupled to a scan voltage signal G(n).

Figure 2:
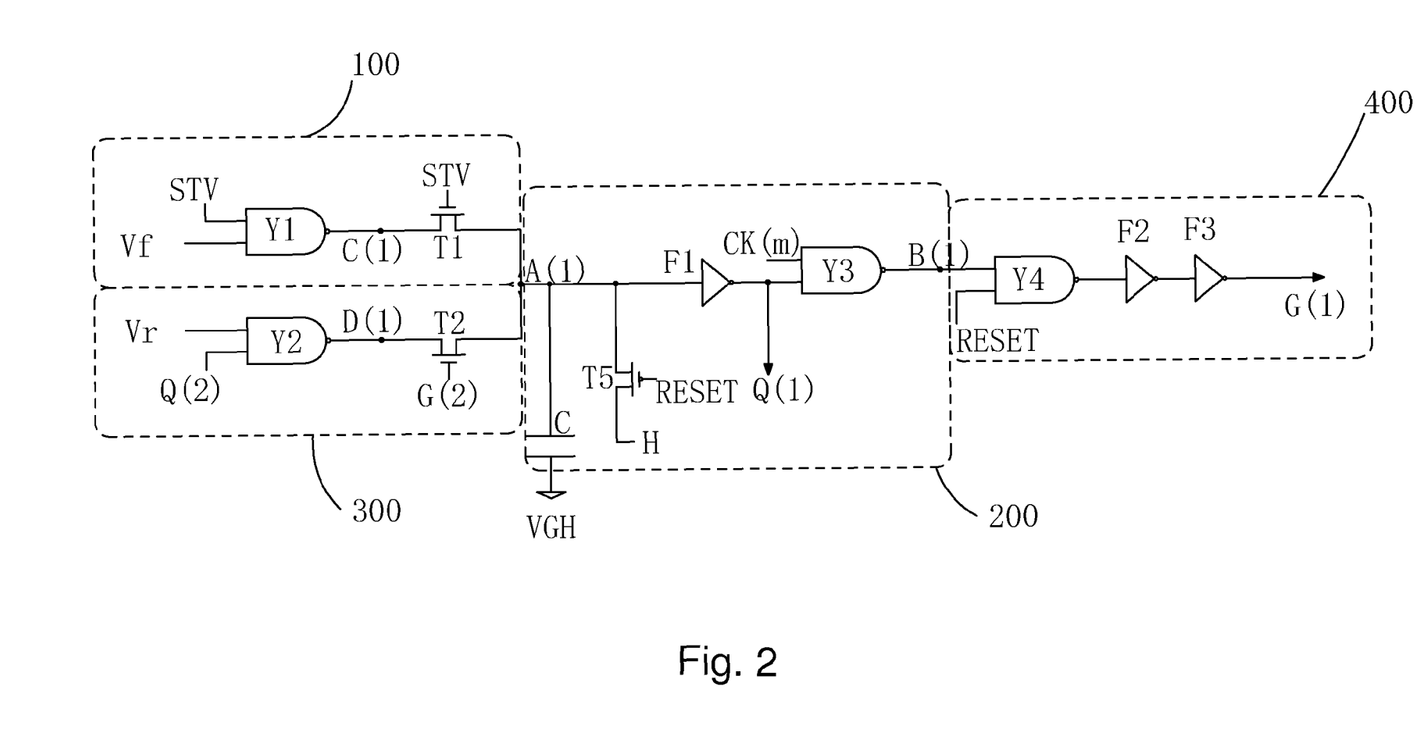
FIG. 2 is a circuit diagram of a CMOS gate driving circuit of the first stage according to the first embodiment of the present invention.
Figure 3:
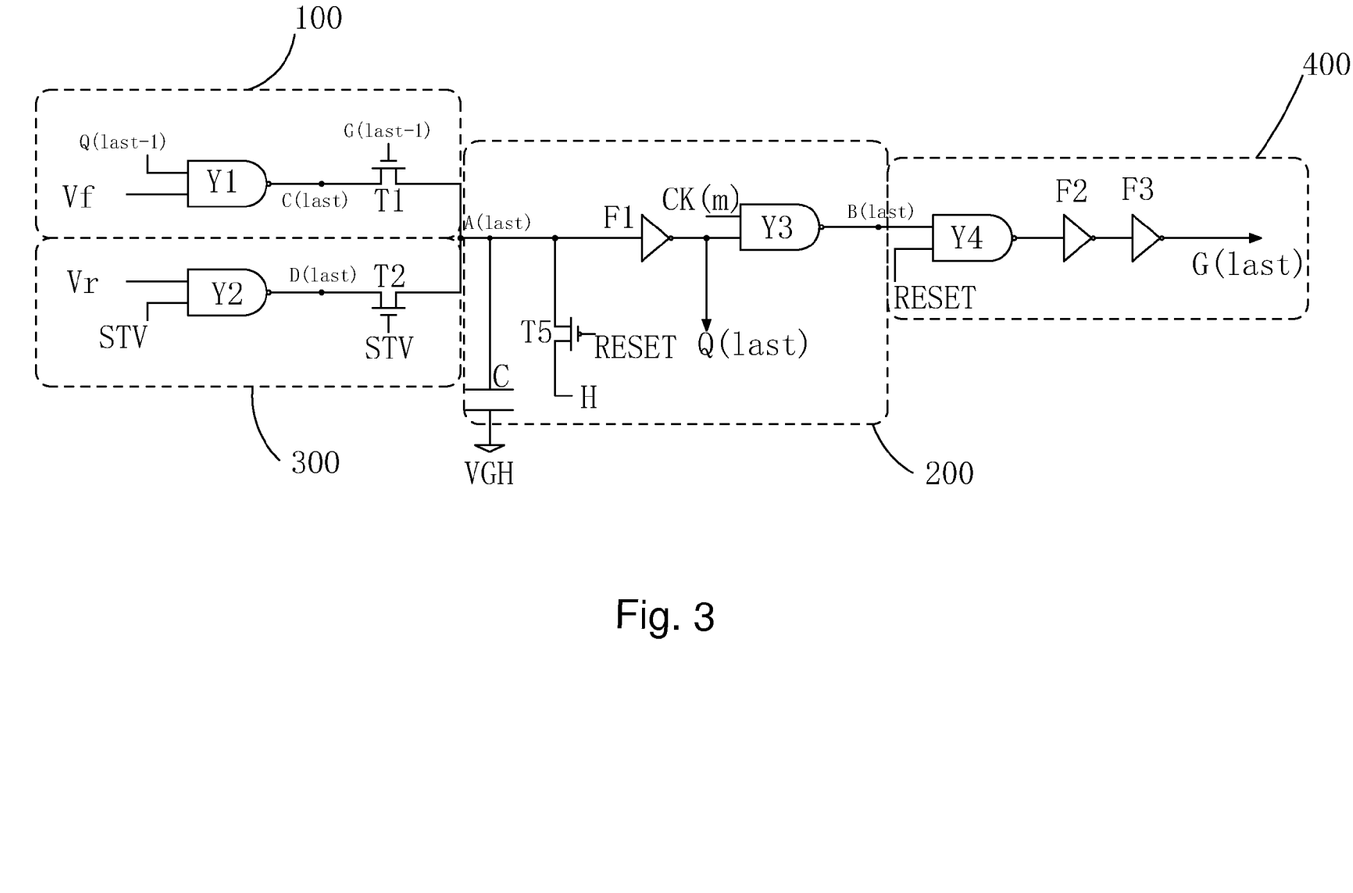
FIG. 3 is a circuit diagram of a CMOS gate driving circuit of the last stage according to the first embodiment of the present invention.

Particularly, as shown in FIG. 2, in the relationship of the first stage of the CMOS gate driving circuit, the gate of the first N-type thin film transistor T1 is electrically coupled to a start signal STV, and the two input ends of the first NAND gate Y1 are electrically coupled to the start signal STV and the forward scan voltage level signal Vf, respectively. As shown in FIG. 3, in the relationship of the last stage of the CMOS gate driving circuit, the gate of the second N-type thin film transistor T2 is electrically coupled to a start signal STV, and the two input ends of the second NAND gate Y2 are electrically coupled to the start signal STV and the backward scan voltage level signal Vr, respectively.

Figure 4:
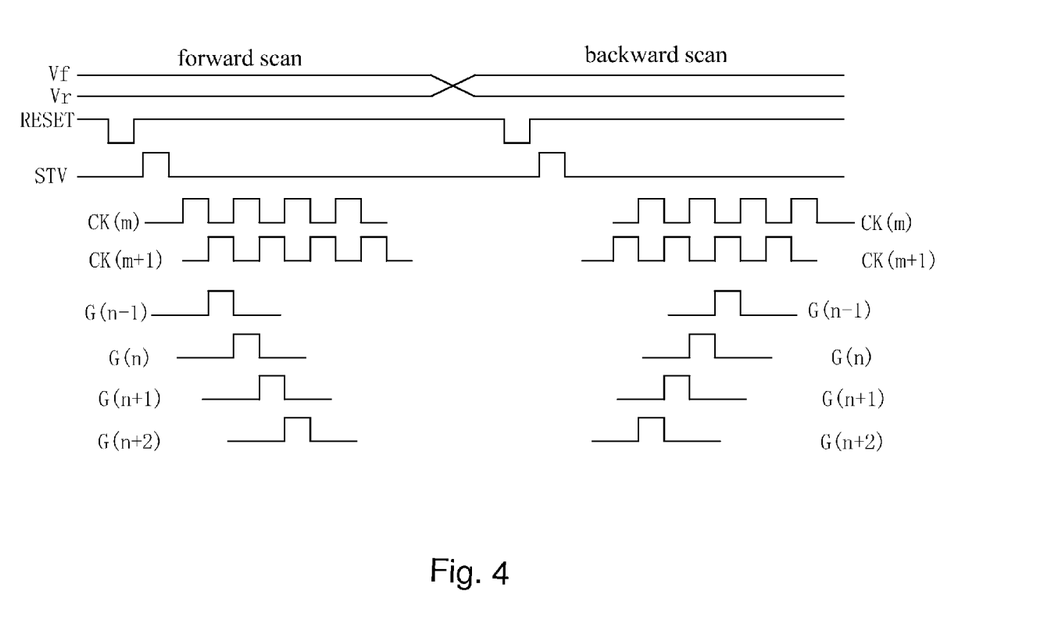
FIG. 4 is a sequence diagram of a CMOS gate driving circuit according to the first embodiment of the present invention.

Please refer to FIG. 4. FIG. 4 is a sequence diagram of the first embodiment of the present invention. As shown in FIG. 4, as the CMOS gate driving circuit forward scans, the forward scan voltage level signal Vf is high voltage level, and the backward scan voltage level signal Vr is low voltage level. As the CMOS gate driving circuit backward scans, the forward scan voltage level signal Vf is low voltage level, and the backward scan voltage level signal Vr is high voltage level. A sequence signal CK(m) comprises two sets of sequence signals: a first sequence signal CK1 and a second sequence signal CK2, and the first, the second sequence signals CK1, CK2 alternately controls the output of the shift register unit according to the orders of the stage transfer.

With conjunction of FIG. 1 and FIG. 4, the forward scan is illustrated. The working procedures of the CMOS gate driving circuit can be divided into five stages, which are specifically described below:

1. Pre-Charge Stage

The first module 100: the forward scan voltage level signal Vf and the stage transfer signal Q(n−1) outputted by the shift register unit of the former stage are high voltage levels. After the first NAND gate Y1, the third node C(n) is low voltage level, and the scan voltage signal G(n−1) outputted by the shift register unit of the former stage is low voltage level, and the first N-type thin film transistor T1 is deactivated, and the first node A(n) maintains to be high voltage level.

The second module 300: the backward scan voltage level signal Vr is low voltage level. After the second NAND gate Y2, the fourth node D(n) is high voltage level, and the scan voltage signal G(n+1) outputted by the shift register unit of the latter stage is low voltage level, and the second N-type thin film transistor T2 is deactivated, and the channel of the fourth node D(n) and the first node A(n) is blockaded.

The latch module 200 and the output module 400: the first node A(n) is high voltage level. After the first NAND gate Y1, the stage transfer signal Q(n) is low voltage level, and after the third NAND gate Y3, the second node B(n) is high voltage level, and the restore signal RESET is high voltage level, and after the fourth NAND gate Y4 and the second, the third inverters F2, F3, the scan voltage signal G(n) is low voltage level.

2. Voltage Level Storage Stage

The first module 100: the forward scan voltage level signal Vf and the stage transfer signal Q(n−1) outputted by the shift register unit of the former stage are high voltage levels. After the first NAND gate Y1, the third node C(n) is low voltage level, and the scan voltage signal G(n−1) outputted by the shift register unit of the former stage is high voltage level, and the first N-type thin film transistor T1 is activated, and the first node A(n) is pulled down to be low voltage level by the third node C(n).

The second module 300: the backward scan voltage level signal Vr is low voltage level. After the second NAND gate Y2, the fourth node D(n) is high voltage level, and the scan voltage signal G(n+1) outputted by the shift register unit of the latter stage is low voltage level, and the second N-type thin film transistor T2 is deactivated, and the channel of the fourth node D(n) and the first node A(n) is blockaded.

The latch module 200 and the output module 400: the first node A(n) is low voltage level. After the first NAND gate Y1, the stage transfer signal Q(n) is high voltage level, and the sequence signal CK(m) is low voltage level, and after the third NAND gate Y3, the second node B(n) is high voltage level, and the restore signal RESET is high voltage level, and after the fourth NAND gate Y4 and the second, the third inverters F2, F3, the scan voltage signal G(n) is low voltage level.

3. Output Stage

The first module 100: the forward scan voltage level signal Vf is high voltage level, and the stage transfer signal Q(n−1) outputted by the shift register unit of the former stage is low voltage level. After the first NAND gate Y1, the third node C(n) is high voltage level, and the scan voltage signal G(n−1) outputted by the shift register unit of the former stage is low voltage level, and the first N-type thin film transistor T1 is deactivated, and the first node A(n) maintains to be low voltage level.

The second module 300: the backward scan voltage level signal Vr is low voltage level. After the second NAND gate Y2, the fourth node D(n) is high voltage level, and the scan voltage signal G(n+1) outputted by the shift register unit of the latter stage is low voltage level, and the second N-type thin film transistor T2 is deactivated, and the channel of the fourth node D(n) and the first node A(n) is blockaded.

The latch module 200 and the output module 400: the first node A(n) is low voltage level. After the first NAND gate Y1, the stage transfer signal Q(n) is high voltage level, and the sequence signal CK(m) is high voltage level, and after the third NAND gate Y3, the second node B(n) is low voltage level, and the restore signal RESET is high voltage level, and after the fourth NAND gate Y4 and the second, the third inverters F2, F3, the scan voltage signal G(n) is high voltage level.

4. Pull-Down Stage

The first module 100: the forward scan voltage level signal Vf is high voltage level, and the stage transfer signal Q(n−1) outputted by the shift register unit of the former stage is low voltage level. After the first NAND gate Y1, the third node C(n) is high voltage level, and the scan voltage signal G(n−1) outputted by the shift register unit of the former stage is low voltage level, and the first N-type thin film transistor T1 is deactivated.

The second module 300: the backward scan voltage level signal Vr is low voltage level. After the second NAND gate Y2, the fourth node D(n) is high voltage level, and the scan voltage signal G(n+1) outputted by the shift register unit of the latter stage is high voltage level, and the second N-type thin film transistor T2 is activated, and the channel of the fourth node D(n) and the first node A(n) is conducted, and the first node A(n) is high voltage level.

The latch module 200 and the output module 400: the first node A(n) is high voltage level. After the first inverter F1, the stage transfer signal Q(n) is low voltage level, and after the third NAND gate Y3, the second node B(n) is high voltage level, and the restore signal RESET is high voltage level, and after the fourth NAND gate Y4 and the second, the third inverters F2, F3, the scan voltage signal G(n) is low voltage level.

5. Pull-Down Holding Stage

The third, the fourth and the first nodes C(n), D(n) and A(n) are high voltage levels, and the stage transfer signal Q(n) is low voltage level. No matter which level the sequence signal CK(m) is, the second node B(n) after the third NAND gate Y3 is high voltage level, and the scan voltage signal G(n) after the fourth NAND gate Y4 and the second, the third inverters F2, F3 is low voltage level.

As shown in the aforesaid working procedures, the latch module 200 keeps the first node A(n) to be low voltage level in an output period, and high voltage level in a latch period. The output module 400 utilizes two inverters coupled in series, of which the output quality can be promoted.

Figure 5:
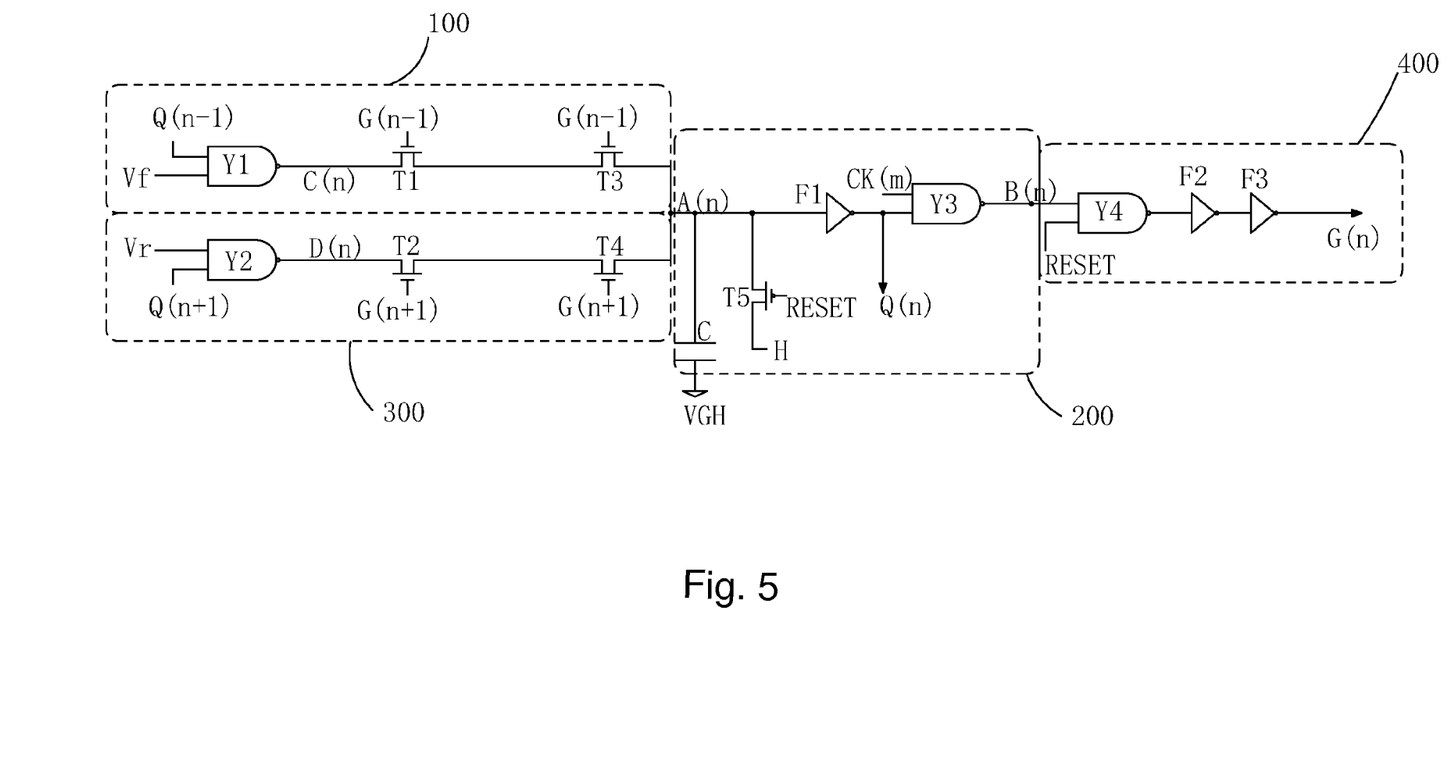
FIG. 5 is a circuit diagram of a CMOS gate driving circuit according to the second embodiment of the present invention.

Please refer to FIG. 5. FIG. 5 is a circuit diagram of the second embodiment of the present invention. The difference between the second embodiment and the first embodiment is: the first module 100 further comprises: a third N-type thin film transistor T3, and a gate of the third N-type thin film transistor T3 is electrically coupled to the scan voltage signal G(n−1) outputted by the shift register unit of the former stage, and a source is electrically coupled to the drain of the first N-type thin film transistor T1, and a drain is electrically coupled to the first node A(n); the second module 200 further comprises: a fourth N-type thin film transistor T4, and a gate of the fourth N-type thin film transistor T4 is electrically coupled to the scan voltage signal G(n+1) outputted by the shift register unit of the latter stage, and a source is electrically coupled to the drain of the second N-type thin film transistor T2, and a drain is electrically coupled to the first node A(n). With adding the third N-type thin film transistor T3, the fourth N-type thin film transistor T4 to be respectively coupled with the first N-type thin film transistor T1, the second N-type thin film transistor T2 in series, the leakage can be effectively prevented. Particularly, in the relationship of the first stage of the second embodiment, the gates of the first, the third N-type thin film transistors T1, T3 are electrically coupled to a start signal STV, and the two input ends of the first NAND gate Y1 are electrically coupled to the start signal STV and the forward scan voltage level signal Vf, respectively; in the relationship of the last stage of the second embodiment, the gates of the second, the fourth N-type thin film transistors T2, T4 are electrically coupled to a start signal STV, and the two input ends of the second NAND gate Y2 are electrically coupled to the start signal STV and the backward scan voltage level signal Vr, respectively. Except the aforesaid difference, others are the same as the first embodiment. The repeated description is omitted here.

Figure 6:
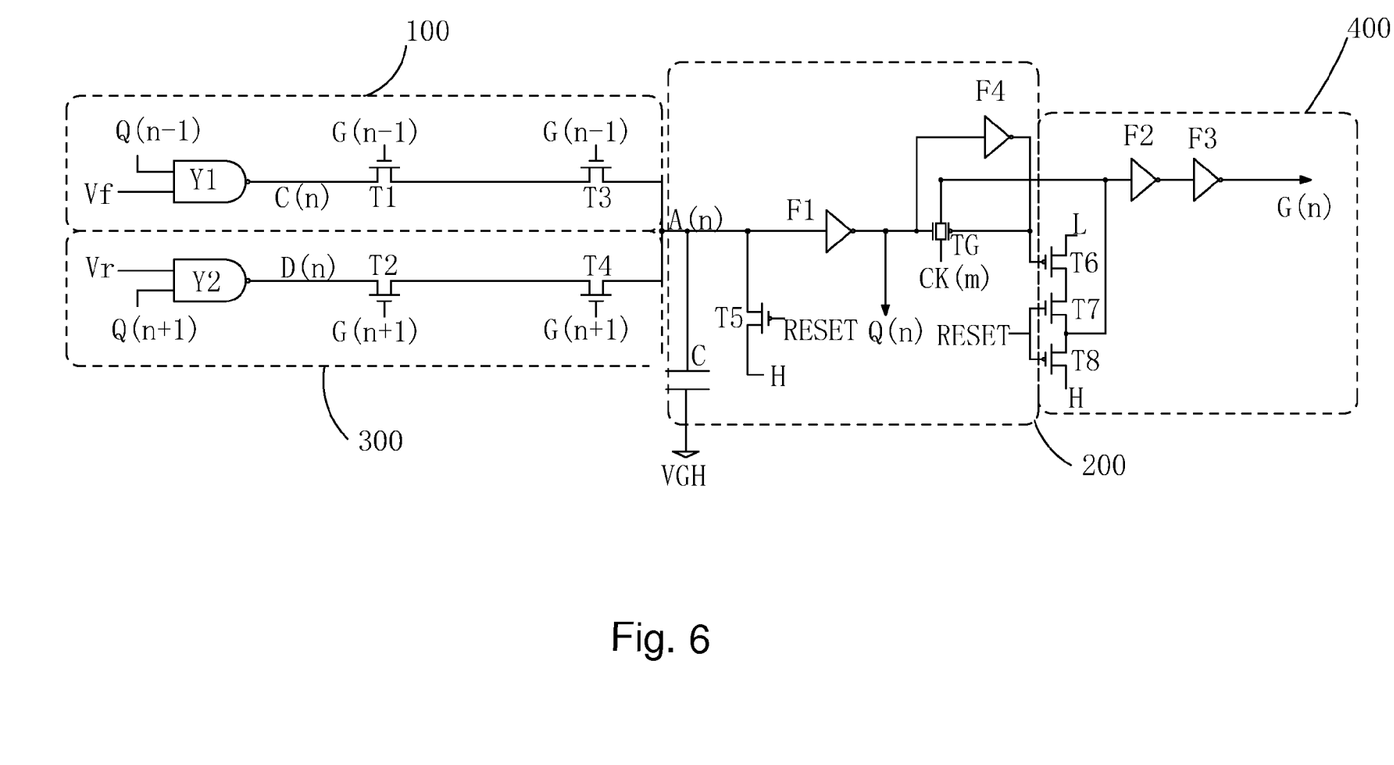
FIG. 6 is a circuit diagram of a CMOS gate driving circuit according to the third embodiment of the present invention.

Please refer to FIG. 6. FIG. 6 is a circuit diagram of the third embodiment of the present invention. The difference between the third embodiment and the second embodiment is that a transmission gate is utilized for achieving the circuit output.

Specifically, in the third embodiment, the latch module 200 comprises: a fifth P-type thin film transistor T5, and a gate of the fifth P-type thin film transistor T5 is electrically coupled to a restore signal RESET, and a source is electrically coupled to a constant high voltage level H, and a drain is electrically coupled to the first node A(n); a first inverter F1, and an input end of the first inverter F1 is electrically coupled to the first node A(n), and an output end is electrically coupled to a stage transfer signal Q(n) and a gate of a N-type thin film transistor of a transmission gate TG; the transmission gate TG, comprising the N-type thin film transistor and a P-type thin film transistor, and the gate of the N-type thin film transistor is electrically coupled to the output end of the first inverter F1 and the input end of the fourth inverter F4, and a source is electrically coupled to a source of the P-type thin film transistor and a sequence signal CK(m), and a drain is electrically coupled to a drain of the P-type thin film transistor and the input end of the second inverter F2, and a gate of the P-type thin film transistor is electrically coupled to the output end of the fourth inverter F4 and a gate of a sixth P-type thin film transistor T6, and a source is electrically coupled to the source of the N-type thin film transistor and the sequence signal CK(m), and a drain is electrically coupled to the drain of the N-type thin film transistor and the input end of the second inverter F2; a capacitor C, and one end of the capacitor C is electrically coupled to the first node A(n), and the other end is electrically coupled to the constant high voltage level VGH.

The output module 400 comprises: the sixth P-type thin film transistor T6, and the gate of the sixth P-type thin film transistor T6 is electrically coupled to the output end of the fourth inverter F4 and the gate of the P-type thin film transistor of the transmission gate TG, and a source is electrically coupled to a constant low voltage level L, and a drain is electrically coupled to a source of a seventh N-type thin film transistor T7; the seventh N-type thin film transistor T7, and a gate of the seventh N-type thin film transistor T7 is electrically coupled to the restore signal RESET and a gate of an eighth P-type thin film transistor T8, and a source is electrically coupled to the drain of the sixth P-type thin film transistor T6, and a drain is electrically coupled to a source of the eighth P-type thin film transistor T8 and the input end of the second inverter F2; the eighth P-type thin film transistor T8, and the gate of the eighth P-type thin film transistor T8 is electrically coupled to the restore signal RESET and the gate of the seventh N-type thin film transistor T7, and a source is electrically coupled to the drain of the seventh N-type thin film transistor T7 and the input end of the second inverter F2, and a drain is electrically coupled to a constant high voltage level H; the second inverter F2, and the input end of the second inverter F2 is electrically coupled to the drain of the seventh N-type thin film transistor T7 and the drain of the P-type thin film transistor of the transmission gate TG, and the output end is electrically coupled to an input end of a third inverter F3; the third inverter F3, the input end of the third inverter F3 is electrically coupled to the output end of the second inverter F2, and an output end is electrically coupled to a scan voltage signal G(n).

Except the aforesaid difference, others are the same as the second embodiment. The repeated description is omitted here.

Figure 7:
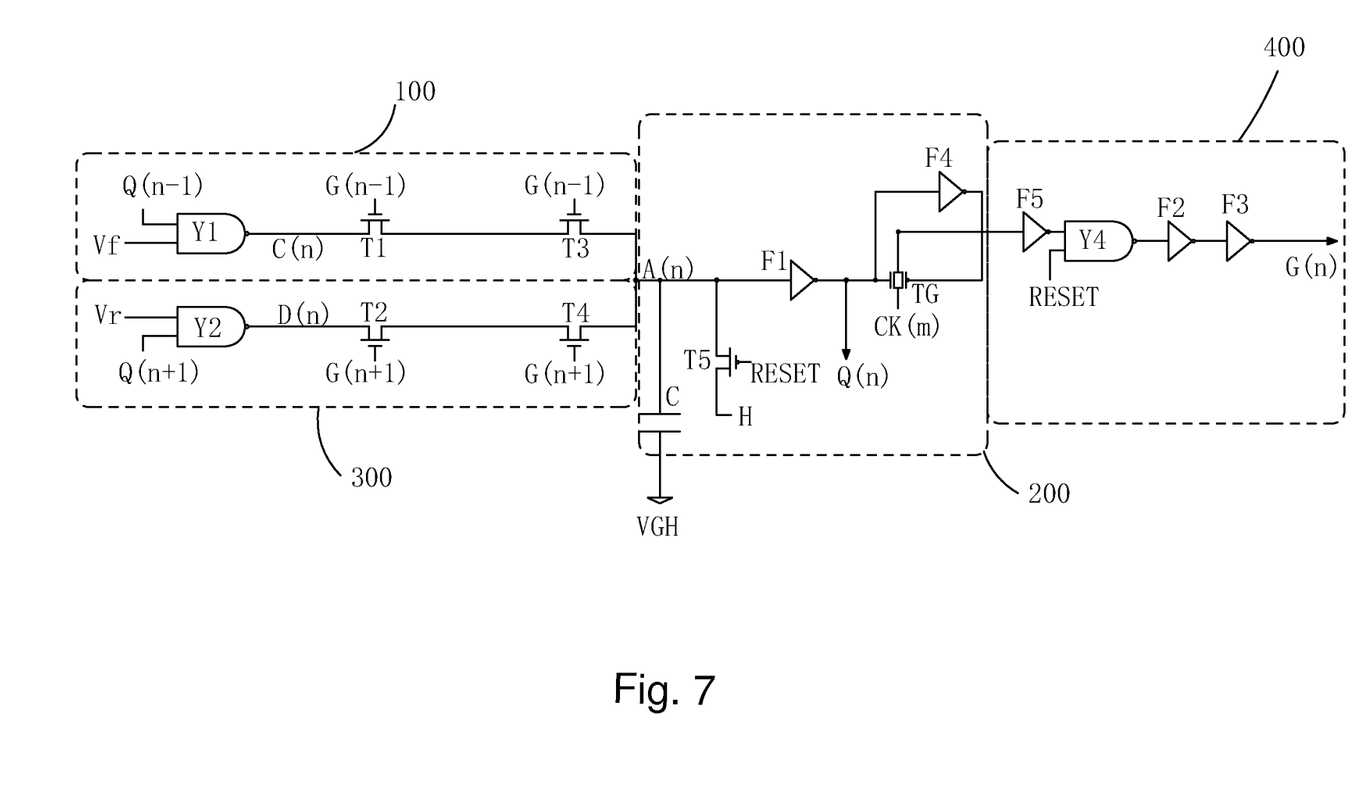
FIG. 7 is a circuit diagram of a CMOS gate driving circuit according to the fourth embodiment of the present invention.

Please refer to FIG. 7. FIG. 7 is a circuit diagram of the fourth embodiment of the present invention. The difference between the fourth embodiment and the third embodiment is that a NAND gate is utilized for achieving the restore setting.

Specifically, in the fourth embodiment, the latch module 200 comprises: a fifth P-type thin film transistor T5, and a gate of the fifth P-type thin film transistor T5 is electrically coupled to a restore signal RESET, and a source is electrically coupled to a constant high voltage level H, and a drain is electrically coupled to the first node A(n); a first inverter F1, and an input end of the first inverter F1 is electrically coupled to the first node A(n), and an output end is electrically coupled to a stage transfer signal Q(n) and a gate of an N-type thin film transistor of a transmission gate TG; the transmission gate TG, comprising the N-type thin film transistor and a P-type thin film transistor, and the gate of the N-type thin film transistor is electrically coupled to the output end of the first inverter F1 and the input end of the fourth inverter F4, and a source is electrically coupled to a source of the P-type thin film transistor and a sequence signal CK(m), and a drain is electrically coupled to a drain of the P-type thin film transistor and the input end of the fifth inverter F5, and a gate of the P-type thin film transistor is electrically coupled to the output end of the fourth inverter F4, and a source is electrically coupled to the source of the N-type thin film transistor and the sequence signal CK(m), and a drain is electrically coupled to the drain of the N-type thin film transistor and the input end of the fifth inverter F5; a capacitor C, and one end of the capacitor C is electrically coupled to the first node A(n), and the other end is electrically coupled to the constant high voltage level VGH.

The output module 400 comprises: a fifth inverter F5, and an input end of the fifth inverter F5 is electrically coupled to the drain of the N-type thin film transistor of the transmission gate TG, and an output end is electrically coupled to an input end of a fourth NAND gate Y4; the fourth NAND gate Y4, and two input ends of the fourth NAND gate Y4 are electrically coupled to the output end of the fifth inverter F5 and the restore signal RESET, respectively, and an output end is electrically coupled to an input end of a second inverter F2; the second inverter F2, and the input end of the second inverter F2 is electrically coupled to an output end of the fourth NAND gate Y4, and an output end is electrically coupled to an input end of a third inverter F3; the third inverter F3, and the input end of the third inverter F3 is electrically coupled to the output end of the second inverter F2, and an output end is electrically coupled to a scan voltage signal G(n).

Except the aforesaid difference, others are the same as the third embodiment. The repeated description is omitted here.

In conclusion, the CMOS gate driving circuit of the present invention is capable realizing the forward-backward scan with NAND gates and ensuring the stability of the GOA function and the smooth output of the scan voltage signal to raise the stage transfer efficiency and to effectively reduce the sequence delay of the stage transfer; meanwhile, in the forward-backward scan module, the first module is a transmission module in forward scan and a pull-down module in backward scan, and the second module is a pull-down module in forward scan and a transmission module in backward scan. Thus, the multiple functions of the circuit module can be achieved, and the frame width of the screen can be decreased and the power consumption can be lowered, and particularly, the present invention is applicable to a narrow frame or frameless liquid crystal display.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A CMOS gate driving circuit, comprising a plurality of shift register units which are cascade connected, and n is set to be a positive integer, and except the shift register units of the first stage and the last stage, the shift register unit of the nth stage comprises: a forward-backward scan module, a latch module electrically coupled to the forward-backward scan module and an output module electrically coupled to the latch module;

the forward-backward scan module comprises: a first module and a second module, and the first module is a transmission module in forward scan and a pull-down module in backward scan; the second module is a pull-down module in forward scan and a transmission module in backward scan;

the first module comprises: a first NAND gate, and two input ends of the first NAND gate are electrically coupled to a forward scan voltage level signal and a stage transfer signal outputted by the shift register unit of the former stage, respectively, and an output end is electrically coupled to a third node; a first N-type thin film transistor, and a gate of the first N-type thin film transistor is electrically coupled to a scan voltage signal outputted by the shift register unit of the former stage, and a source is electrically coupled to the third node, and a drain is electrically coupled to a first node;

the second module comprises: a second NAND gate, and two input ends of the second NAND gate are electrically coupled to a backward scan voltage level signal and a stage transfer signal outputted by the shift register unit of the latter stage, respectively, and an output end is electrically coupled to a fourth node; a second N-type thin film transistor, and a gate of the second N-type thin film transistor is electrically coupled to a scan voltage signal outputted by the shift register unit of the latter stage, and a source is electrically coupled to the fourth node, and a drain is electrically coupled to the first node;

in forward scan, the forward scan voltage level signal is high voltage level, and the backward scan voltage level signal is low voltage level;

in backward scan, the forward scan voltage level signal is low voltage level, and the backward scan voltage level signal is high voltage level.

2. The CMOS gate driving circuit according to claim 1, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node;

a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

3. The CMOS gate driving circuit according to claim 1, wherein in the relationship of the first stage of the CMOS gate driving circuit, the gate of the first N-type thin film transistor is electrically coupled to a start signal, and the two input ends of the first NAND gate are electrically coupled to the start signal and the forward scan voltage level signal, respectively; in the relationship of the last stage of the CMOS gate driving circuit, the gate of the second N-type thin film transistor is electrically coupled to a start signal, and the two input ends of the second NAND gate are electrically coupled to the start signal and the backward scan voltage level signal, respectively.

4. The CMOS gate driving circuit according to claim 1, wherein the first module further comprises: a third N-type thin film transistor, and a gate of the third N-type thin film transistor is electrically coupled to the scan voltage signal outputted by the shift register unit of the former stage, and a source is electrically coupled to the drain of the first N-type thin film transistor, and a drain is electrically coupled to the first node;

the second module further comprises: a fourth N-type thin film transistor, and a gate of the fourth N-type thin film transistor is electrically coupled to the scan voltage signal outputted by the shift register unit of the latter stage, and a source is electrically coupled to the drain of the second N-type thin film transistor, and a drain is electrically coupled to the first node.

5. The CMOS gate driving circuit according to claim 4, wherein in the relationship of the first stage of the CMOS gate driving circuit, the gates of the first, the third N-type thin film transistors are electrically coupled to a start signal, and the two input ends of the first NAND gate are electrically coupled to the start signal and the forward scan voltage level signal, respectively; in the relationship of the last stage of the CMOS gate driving circuit, the gate of the second, the fourth N-type thin film transistors are electrically coupled to a start signal, and the two input ends of the second NAND gate are electrically coupled to the start signal and the backward scan voltage level signal, respectively.

6. The CMOS gate driving circuit according to claim 4, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node; a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

7. The CMOS gate driving circuit according to claim 4, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of an N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the second inverter, and a gate of the P-type thin film transistor is electrically coupled to the output end of the fourth inverter and a gate of a sixth P-type thin film transistor, and a source is electrically coupled to the source of the N-type thin film transistor and the sequence signal, and a drain is electrically coupled to the drain of the N-type thin film transistor and the input end of the second inverter; a capacitor, and one end of the capacitor is electrically coupled to the first node, and the other end is electrically coupled to the constant high voltage level;

the output module comprises: the sixth P-type thin film transistor, and the gate of the sixth P-type thin film transistor is electrically coupled to the output end of the fourth inverter and the gate of the P-type thin film transistor of the transmission gate, and a source is electrically coupled to a constant low voltage level, and a drain is electrically coupled to a source of a seventh N-type thin film transistor; the seventh N-type thin film transistor, and a gate of the seventh N-type thin film transistor is electrically coupled to the restore signal and a gate of an eighth P-type thin film transistor, and a source is electrically coupled to the drain of the sixth P-type thin film transistor, and a drain is electrically coupled to a source of the eighth P-type thin film transistor and the input end of the second inverter; the eighth P-type thin film transistor, and the gate of the eighth P-type thin film transistor is electrically coupled to the restore signal and the gate of the seventh N-type thin film transistor, and a source is electrically coupled to the drain of the seventh N-type thin film transistor and the input end of the second inverter, and a drain is electrically coupled to a constant high voltage level; the second inverter, and the input end of the second inverter is electrically coupled to the drain of the seventh N-type thin film transistor and the drain of the P-type thin film transistor of the transmission gate, and the output end is electrically coupled to an input end of a third inverter; the third inverter, the input end of the third inverter is electrically coupled to the output end of the second inverter, and an output end is electrically coupled to a scan voltage signal.

8. The CMOS gate driving circuit according to claim 4, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of a N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the fifth inverter, and a gate of the P-type thin film transistor is electrically coupled to the output end of the fourth inverter, and a source is electrically coupled to the source of the N-type thin film transistor and the sequence signal, and a drain is electrically coupled to the drain of the N-type thin film transistor and the input end of the fifth inverter; a capacitor, and one end of the capacitor is electrically coupled to the first node, and the other end is electrically coupled to the constant high voltage level;

the output module comprises: a fifth inverter, and an input end of the fifth inverter is electrically coupled to the drain of the N-type thin film transistor of the transmission gate, and an output end is electrically coupled to an input end of a fourth NAND gate; the fourth NAND gate, and two input ends of the fourth NAND gate are electrically coupled to the output end of the fifth inverter and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

9. The CMOS gate driving circuit according to claim 1, wherein a sequence signal comprises two sets of sequence signals: a first sequence signal and a second sequence signal.

10. The CMOS gate driving circuit according to claim 1, wherein the latch module keeps the first node to be low voltage level in an output period, and high voltage level in a latch period.

11. A CMOS gate driving circuit, comprising a plurality of shift register units which are cascade connected, and n is set to be a positive integer, and except the shift register units of the first stage and the last stage, the shift register unit of the nth stage comprises: a forward-backward scan module, a latch module electrically coupled to the forward-backward scan module and an output module electrically coupled to the latch module;

the forward-backward scan module comprises: a first module and a second module, and the first module is a transmission module in forward scan and a pull-down module in backward scan; the second module is a pull-down module in forward scan and a transmission module in backward scan;

the first module comprises: a first NAND gate, and two input ends of the first NAND gate are electrically coupled to a forward scan voltage level signal and a stage transfer signal outputted by the shift register unit of the former stage, respectively, and an output end is electrically coupled to a third node; a first N-type thin film transistor, and a gate of the first N-type thin film transistor is electrically coupled to a scan voltage signal outputted by the shift register unit of the former stage, and a source is electrically coupled to the third node, and a drain is electrically coupled to a first node;

the second module comprises: a second NAND gate, and two input ends of the second NAND gate are electrically coupled to a backward scan voltage level signal and a stage transfer signal outputted by the shift register unit of the latter stage, respectively, and an output end is electrically coupled to a fourth node; a second N-type thin film transistor, and a gate of the second N-type thin film transistor is electrically coupled to a scan voltage signal outputted by the shift register unit of the latter stage, and a source is electrically coupled to the fourth node, and a drain is electrically coupled to the first node;

in forward scan, the forward scan voltage level signal is high voltage level, and the backward scan voltage level signal is low voltage level;

in backward scan, the forward scan voltage level signal is low voltage level, and the backward scan voltage level signal is high voltage level;

wherein a sequence signal comprises two sets of sequence signals: a first sequence signal and a second sequence signal;

wherein the latch module keeps the first node to be low voltage level in an output period, and high voltage level in a latch period.

12. The CMOS gate driving circuit according to claim 11, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node; a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

13. The CMOS gate driving circuit according to claim 11, wherein in the relationship of the first stage of the CMOS gate driving circuit, the gate of the first N-type thin film transistor is electrically coupled to a start signal, and the two input ends of the first NAND gate are electrically coupled to the start signal and the forward scan voltage level signal, respectively; in the relationship of the last stage of the CMOS gate driving circuit, the gate of the second N-type thin film transistor is electrically coupled to a start signal, and the two input ends of the second NAND gate are electrically coupled to the start signal and the backward scan voltage level signal, respectively.

14. The CMOS gate driving circuit according to claim 11, wherein the first module further comprises: a third N-type thin film transistor, and a gate of the third N-type thin film transistor is electrically coupled to the scan voltage signal outputted by the shift register unit of the former stage, and a source is electrically coupled to the drain of the first N-type thin film transistor, and a drain is electrically coupled to the first node;

the second module further comprises: a fourth N-type thin film transistor, and a gate of the fourth N-type thin film transistor is electrically coupled to the scan voltage signal outputted by the shift register unit of the latter stage, and a source is electrically coupled to the drain of the second N-type thin film transistor, and a drain is electrically coupled to the first node.

15. The CMOS gate driving circuit according to claim 14, wherein in the relationship of the first stage of the CMOS gate driving circuit, the gates of the first, the third N-type thin film transistors are electrically coupled to a start signal, and the two input ends of the first NAND gate are electrically coupled to the start signal and the forward scan voltage level signal, respectively; in the relationship of the last stage of the CMOS gate driving circuit, the gate of the second, the fourth N-type thin film transistors are electrically coupled to a start signal, and the two input ends of the second NAND gate are electrically coupled to the start signal and the backward scan voltage level signal, respectively.

16. The CMOS gate driving circuit according to claim 14, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and an input end of a third NAND gate; the third NAND gate, and two input ends of the third NAND gate are electrically coupled to a sequence signal and the output end of the first inverter, respectively, and an output end is electrically coupled to a second node; a capacitor, and one end of the capacitor is electrically coupled to the first node, and the other end is electrically coupled to the constant high voltage level;

the output module comprises: a fourth NAND gate, and two input ends of the fourth NAND gate are electrically coupled to the second node and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

17. The CMOS gate driving circuit according to claim 14, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of an N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the second inverter, and a gate of the P-type thin film transistor is electrically coupled to the output end of the fourth inverter and a gate of a sixth P-type thin film transistor, and a source is electrically coupled to the source of the N-type thin film transistor and the sequence signal, and a drain is electrically coupled to the drain of the N-type thin film transistor and the input end of the second inverter; a capacitor, and one end of the capacitor is electrically coupled to the first node, and the other end is electrically coupled to the constant high voltage level;

the output module comprises: the sixth P-type thin film transistor, and the gate of the sixth P-type thin film transistor is electrically coupled to the output end of the fourth inverter and the gate of the P-type thin film transistor of the transmission gate, and a source is electrically coupled to a constant low voltage level, and a drain is electrically coupled to a source of a seventh N-type thin film transistor; the seventh N-type thin film transistor, and a gate of the seventh N-type thin film transistor is electrically coupled to the restore signal and a gate of an eighth P-type thin film transistor, and a source is electrically coupled to the drain of the sixth P-type thin film transistor, and a drain is electrically coupled to a source of the eighth P-type thin film transistor and the input end of the second inverter; the eighth P-type thin film transistor, and the gate of the eighth P-type thin film transistor is electrically coupled to the restore signal and the gate of the seventh N-type thin film transistor, and a source is electrically coupled to the drain of the seventh N-type thin film transistor and the input end of the second inverter, and a drain is electrically coupled to a constant high voltage level; the second inverter, and the input end of the second inverter is electrically coupled to the drain of the seventh N-type thin film transistor and the drain of the P-type thin film transistor of the transmission gate, and the output end is electrically coupled to an input end of a third inverter; the third inverter, the input end of the third inverter is electrically coupled to the output end of the second inverter, and an output end is electrically coupled to a scan voltage signal.

18. The CMOS gate driving circuit according to claim 14, wherein the latch module comprises: a fifth P-type thin film transistor, and a gate of the fifth P-type thin film transistor is electrically coupled to a restore signal, and a source is electrically coupled to a constant high voltage level, and a drain is electrically coupled to the first node; a first inverter, and an input end of the first inverter is electrically coupled to the first node, and an output end is electrically coupled to a stage transfer signal and a gate of a N-type thin film transistor of a transmission gate; the transmission gate, comprising the N-type thin film transistor and a P-type thin film transistor, and the gate of the N-type thin film transistor is electrically coupled to the output end of the first inverter and the input end of the fourth inverter, and a source is electrically coupled to a source of the P-type thin film transistor and a sequence signal, and a drain is electrically coupled to a drain of the P-type thin film transistor and the input end of the fifth inverter, and a gate of the P-type thin film transistor is electrically coupled to the output end of the fourth inverter, and a source is electrically coupled to the source of the N-type thin film transistor and the sequence signal, and a drain is electrically coupled to the drain of the N-type thin film transistor and the input end of the fifth inverter; a capacitor, and one end of the capacitor is electrically coupled to the first node, and the other end is electrically coupled to the constant high voltage level;

the output module comprises: a fifth inverter, and an input end of the fifth inverter is electrically coupled to the drain of the N-type thin film transistor of the transmission gate, and an output end is electrically coupled to an input end of a fourth NAND gate; the fourth NAND gate, and two input ends of the fourth NAND gate are electrically coupled to the output end of the fifth inverter and the restore signal, respectively, and an output end is electrically coupled to an input end of a second inverter; the second inverter, and the input end of the second inverter is electrically coupled to an output end of the fourth NAND gate, and an output end is electrically coupled to an input end of a third inverter; the third inverter, and the input end of the third inverter is electrically coupled to the output end of the second inverter, and an output end is electrically coupled to a scan voltage signal.

\* \* \* \* \*